United States Patent [19]

Vromans et al.

[11] Patent Number: 5,272,534
[45] Date of Patent: Dec. 21, 1993

[54] TELEVISION RECEIVER WITH AUTOMATIC TUNING CONTROL

[75] Inventors: Johannes S. Vromans; Hubertus J. F. Maas, both of Eindhoven, Netherlands; Johannes Dollee, Tokyo, Japan

[73] Assignee: U.S. Philips Corporation, New York, N.Y.

[21] Appl. No.: 878,656

[22] Filed: May 5, 1992

[30] Foreign Application Priority Data

May 10, 1991 [EP] European Pat. Off. ........ 91201134.3

[51] Int. Cl.$^5$ .......................... H04N 5/44; H04N 5/50
[52] U.S. Cl. .................................. 358/191.1; 358/188; 358/195.1; 455/257; 455/265
[58] Field of Search .................. 358/188, 191.1, 193.1, 358/195.1; 455/257, 260, 265, 192.1, 209; 331/11, 16, 18, 25, 176, 23

[56] References Cited

U.S. PATENT DOCUMENTS

| | | | |
|---|---|---|---|
| 4,253,118 | 2/1981 | Flaza | 358/188 |
| 4,261,016 | 4/1981 | Hongu et al. | 358/195.1 |
| 4,524,389 | 6/1985 | Isobo et al. | 358/188 |
| 4,823,399 | 4/1989 | George | 358/195.1 |
| 4,890,071 | 12/1989 | Curtis | 331/11 |
| 4,929,905 | 5/1990 | Ruitenburg | 358/188 |

Primary Examiner—James J. Groody
Assistant Examiner—Michael H. Lee
Attorney, Agent, or Firm—Edward W. Goodman

[57] ABSTRACT

TV receiver including an RF section, a mixer stage to which a tuning frequency is applied from a tuning oscillator, an IF section, a synchronous detection device and a frequency and phase-locked loop circuit having a PLL and a FLL, the IF section being coupled to a phase detector of the PLL and to a frequency detection device of the FLL, the phase detector and frequency detection device being commonly coupled to a loop branch having the two loops in common and incorporating a loop filter and a controllable oscillator, the controllable oscillator applying a local in-phase carrier to the synchronous detection device and a local phase quadrature carrier to the phase detector. To improve the tuning behavior, an output of the loop filter is coupled to a circuit for generating a tuning control signal, this circuit including a comparison circuit for deriving a tuning control signal for the tuning oscillator from the difference between the value of the control signal of the controllable oscillator and a reference value, the controllable oscillator supplying an oscillator frequency which is equal to the intermediate frequency in the case of a control signal of the reference value.

8 Claims, 2 Drawing Sheets

TELEVISION RECEIVER WITH AUTOMATIC TUNING CONTROL

BACKGROUND OF THE INVENTION

1. Field of the Invention

The invention relates to a television (TV) receiver comprising a radio frequency (RF) section, a mixer stage to which a tuning frequency is applied from a tuning oscillator, an intermediate frequency (IF) section, a synchronous detection device and a frequency and phase-locked loop (FPLL) circuit which comprises a phase-locked loop (PLL) and a frequency-locked loop (FLL), said IF section being coupled to a phase detector of the PLL and to a frequency detection device of the FLL, said phase detector and frequency detection device being commonly coupled to a loop branch having the two loops in common and incorporating a loop filter and a controllable oscillator, said controllable oscillator applying a local in-phase carrier to the synchronous detection device and a local phase quadrature carrier, to the phase detector.

2. Description of the Related Art

A TV receiver of this type is known from the article "Modular video IF concept" by M. Huber et al. published in IEEE Transactions on CE, Vol. CE-29, No. 3, Aug. 1983, pp. 414-418.

In the mixer stage of the known TV receiver, a desired RF TV reception signal is converted into a TV IF signal by means of a suitably chosen tuning frequency. In the synchronous detection device, the TV IF signal is synchronously detected, which results in a baseband TV signal. The local synchronous IF detection carrier required for synchronous detection and hereinafter briefly referred to as the local IF carrier is obtained by means of a controllable oscillator incorporated in a PLL. For a correct synchronous detection the local IF carrier should be equal in frequency and phase to the IF carrier frequency of the received TV signal, hereinafter briefly referred to as the actual IF carrier frequency. In practice this requirement means that the PLL should have a comparatively narrow band.

Consequently, the capture range of the PLL is too small to realize an acceptable tuning behavior as such. To improve the tuning behavior, the PLL in the known TV receiver is combined with an FLL, making common use of the loop filter and the controllable oscillator so that the FLL acts on the controllable oscillator of the PLL via the loop filter. The capture range of the FLL is to be chosen considerably larger than that of the PLL. Due to the combined frequency and phase control, this loop combination is also referred to as frequency and phase-locked loop (FPLL).

The FPLL is mainly employed to establish a frequency and phase synchronization of the local IF carrier on the actual IF carrier. In the case of frequency deviations between the local and actual IF carriers within the capture range of the FLL, the FLL brings the frequency of the local IF carrier sufficiently close to that of the actual IF carrier so as to enable the PLL to lock in. The PLL subsequently realizes a phase synchronization between the actual and the local IF carrier.

For a correct signal processing, notably in the IF section, the actual IF carrier frequency should also be equal to the intermediate frequency to which the IF section is tuned, hereinafter briefly referred to as the correct intermediate frequency. To this end the frequency of the tuning oscillator is to be controlled at a value by which the intermediate frequency deviates from the carrier frequency of the desired RF TV reception signal. A realization of such a control is not shown in said article.

SUMMARY OF THE INVENTION

It is an object of the invention to improve the tuning behavior of the known TV receiver in a simple manner.

It is a further object of the invention to improve the audio signal processing of the known TV receiver in a simple manner.

To realize the first-mentioned object a TV receiver of the type described in the opening paragraph according to the invention is characterized in that an output of the loop filter is coupled to a circuit for generating a tuning control signal, which circuit comprises a comparison circuit for deriving a tuning control signal for the tuning oscillator from the difference between the value of the control signal of the controllable oscillator and a reference value, said controllable oscillator supplying an oscillator frequency which is equal to said correct intermediate frequency in the case of a control signal of the reference value.

When the measure according to the invention is used, the FPLL has a dual function: not only is the FPLL used for realizing a frequency and phase synchronization between an actual IF carrier and a local IF carrier within a comparatively large capture range, but it is also used for generating an automatic tuning control signal for the tuning oscillator so as to control the actual IF carrier frequency at the correct intermediate frequency.

Since the control of both the controllable oscillator and the tuning oscillator is realized by means of the output signal of the loop filter of the FPLL, a suitably chosen derivation of the tuning control signal from the last-mentioned output signal may easily lead to a tuning of the TV receiver at a TV transmitter frequency in the following manner:

In the case of a tuning variation in which the actual IF carrier approaches the free running frequency of the controllable oscillator over a value which is smaller than the capture range of the FLL of the FPLL, the FLL controls the frequency of the local IF carrier to that of the actual IF carrier.

If the frequency of the local IF carrier has approached that of the actual IF carrier to such an extent that the frequency difference between these two IF carriers is smaller than the capture range of the PLL, the contribution of the PLL to the frequency control will be greater than that of the FLL and the PLL realizes a frequency and phase synchronization between the local and actual IF carriers.

At that moment the synchronizing signal of the TV transmitter signal can already be recognized, although the local and actual IF carriers deviate in frequency from the correct IF carrier.

Subsequently a correct tuning to the RF carrier frequency of the relevant TV program signal is effected by means of the tuning control loop, followed by a frequency and phase synchronization of the local IF carrier at the correct IF carrier.

This tuning behavior provides the possiblity of recognizing the presence of a TV transmitter frequency, even if the tuning is not completely correct. Since the period required by the FPLL to realize a frequency and phase synchronization of the actual IF carrier after capturing the actual IF carrier is comparatively short with respect to the period required for subsequently controlling the tuning oscillator at the correct tuning frequency, the measure according to the invention results, inter alia, in the possibility of a fast recognition of a TV transmitter. This is important, for example, for fast search tuning.

To obtain an unambiguous behavior of the FPLL with respect to the phase lock of the local IF carrier with the actual IF carrier, a TV receiver according to the invention is preferably characterized in that the closed loop gain of the PLL is larger than that of the FLL within the locking range of the PLL.

A further preferred embodiment is characterized in that the phase detector also forms part of the frequency detection device, which frequency detection device comprises a first multiplier circuit coupled to the IF section, followed by a low-pass filter and a second multiplier circuit, the local in-phase carrier being applied to said first multiplier circuit from the controllable oscillator and said second multiplier circuit being coupled to an output of the phase detector, an output of the second multiplier circuit being coupled to the loop filter.

When using this measure, the phase detector is not only active in the PLL but also in the FLL, thus economizing on one multiplier circuit as compared with the mentioned state of the art.

The use of a complex second-order Sallen & Key low-pass filter type as a low-pass filter can be avoided by means of a signal limitation between the low-pass filter and the second multiplier circuit, and a simple integrable first-order low-pass filter may suffice.

For a correct signal processing there should not be any delay time differences between the actual IF signal to be detected and applied to the synchronous detector and the local IF carrier generated in the FPLL. Hence, in the known TV receiver, a delay circuit is incorporated in the signal path of and preceding the synchronous detector.

To avoid such delay time differences, a further preferred embodiment of a TV receiver according to the invention is characterized in that the synchronous detection device and the phase detector have a mutually substantially equal gain.

Since the signal processing in the synchronous detector is linear, which is required for a synchronous detection, the phase detector also has a linear signal processing when using this measure, and in the PLL, unwanted amplitude-phase conversions and delays due to signal limitations in the phase detector are prevented when generating the local IF detection carrier.

A further preferred embodiment, in which the circuit for generating the tuning control signal is incorporated in a search tuning circuit, is characterized in that the circuit for generating the tuning control signal varies the tuning frequency step-wise until the output signal of the loop filter corresponds to a reference value within a given step value, said step value being smaller than the capture range of the FLL.

To improve the audio signal processing with respect to that of the known TV receiver, a TV receiver according to the invention is characterized in that the loop filter has a current signal input and a grounded series RC member comprising a series resistor and a series capacitance, said series resistor being shunted by a shunt capacitance, said shunt capacitance being of the order of 2% to 15% of the series capacitance.

When using this measure, an adequate suppression of phase perturbations on the local in-phase IF carrier due to, inter alia, picture signal components is obtained.

BRIEF DESCRIPTION OF THE DRAWINGS

The invention will be described in greater detail with reference to the Figures given by way of non-limitative examples in the drawings. Corresponding elements have identical reference indications. In the drawings.

DESCRIPTION OF THE PREFERRED EMBODIMENT

Figure 1:
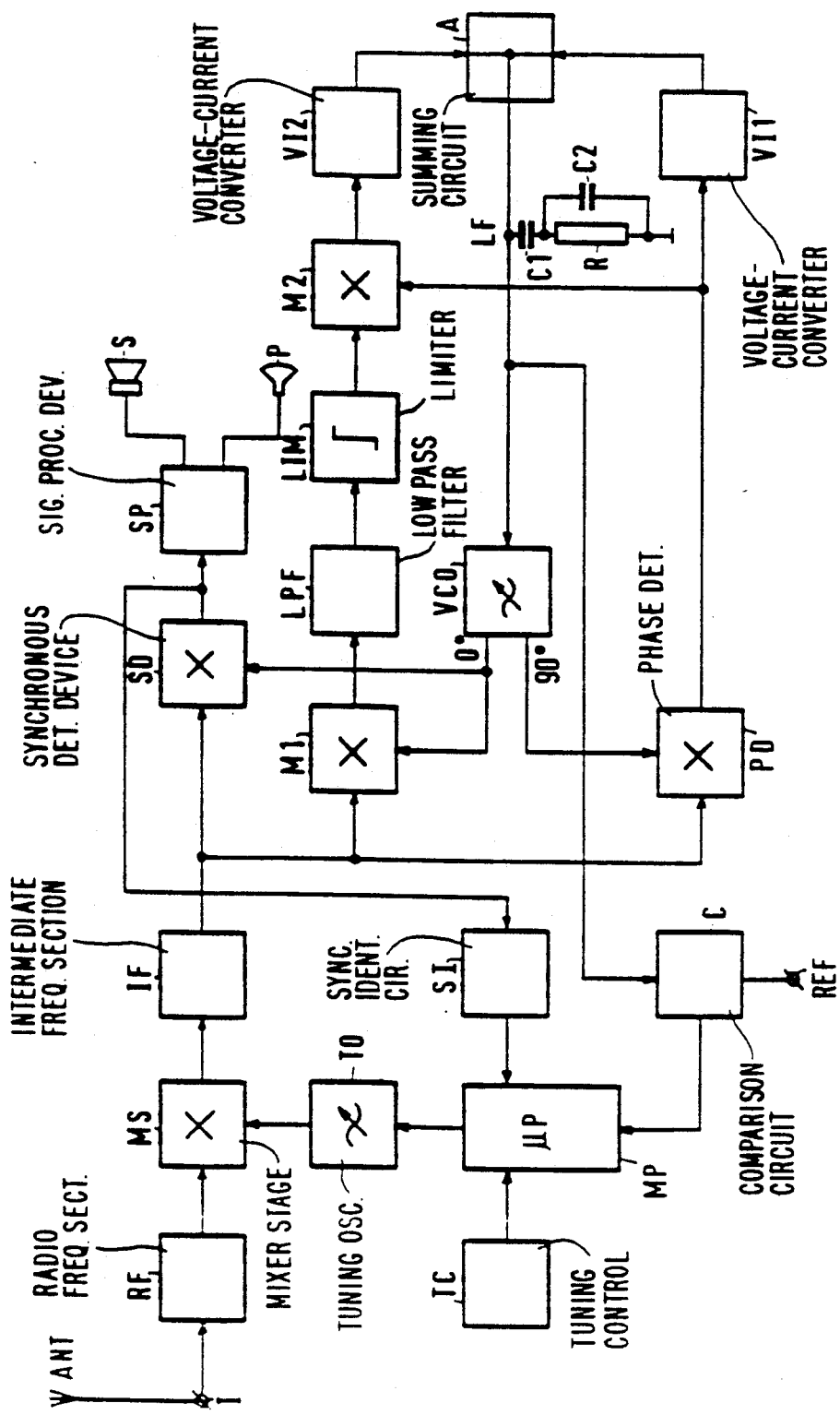
FIG. 1 is a block diagram of a TV receiver according to the invention.

FIG. 1 shows a television (TV) receiver according to the invention, having an RF input I for coupling a TV antenna device ANT thereto and, successively coupled to I, a radio frequency (RF) section RF, a mixer stage MS, an intermediate frequency (IF) section IF, a synchronous detection device SD and a signal processing device SP, outputs of which are coupled to a picture display device P and a sound reproducing device S. A frequency-tunable oscillator mixing signal is applied from a tuning oscillator TO to the mixer stage MS for mixing a desired TV RF reception signal to a TV IF signal. After intermediate frequency selection and amplification in the IF section IF, the TV baseband modulation signal is synchronously detected in the synchronous detection device SD. For a correct synchronous detection of the baseband TV signal, the frequency and phase of the detection carrier required for this purpose should be equal to the carrier of the TV IF signal applied to the synchronous detection device SD, which signal is hereinafter referred to as the actual IF carrier. The detection carrier, hereinafter referred to as the local in-phase IF carrier, is supplied from a frequency and phase-locked loop circuit FPLL.

In the signal processing device SP, the detected baseband TV modulation signal is baseband signal processed, which results in a baseband video signal which is displayed by means of the picture display device P and a baseband audio signal which is reproduced by means of the sound reproducing device S.

An input of the frequency and phase-locked loop FPLL is connected to an output of the IF section IF. The frequency and phase-locked loop FPLL comprises a phase-locked loop PLL (PD, VI1, A, LF, VCO) and a frequency-locked loop FLL (M1, LPF, LIM, M2, PD, VI2, A, LF, VCO). The phase-locked loop PLL comprises a phase detector PD an input of which is connected to an output of the IF section IF and an output of which is successively connected to a first voltage-current converter VI1, a node A functioning as a summing circuit, a loop filter LF and a controlled oscillator VCO. The controlled oscillator VCO has an in-phase and a quadrature output, the quadrature output being coupled to the phase detector PD. The frequency-locked loop FLL comprises a frequency detection device (M1, LPF, LIM, M2, PD), a second voltage-current converter VI2 and the loop filter LF and the controlled oscillator VCO via the node A in a common loop branch with the phase-locked loop PLL. The frequency detection device comprises a first multiplier circuit M1 inputs of which are coupled to an output of the IF section IF and said in-phase output, respectively, of the controlled oscillator VCO and, successively coupled to the first multiplier circuit MI, a low-pass filter LPF, a limiter LIM, a second multiplier circuit M2 and the above-mentioned phase detector PD.

The controlled oscillator VCO supplies via its in-phase output the afore-mentioned local IF in-phase carrier to the synchronous detection device SD as well as to said frequency detection device and a local IF quadrature carrier to the phase detector PD via the quadrature output. In the locked state of FPLL, the phase and hence the frequency of the local in-phase IF carrier corresponds to that of the actual IF carrier and the local quadrature IF carrier differs 90 degrees in phase from the actual IF carrier.

The loop filter LF has a second-order low-pass characteristic and comprises a grounded series RC member (R, C1) which consists of a series capacitance C1 in series with a series resistor R, with a shunt capacitance C2 being arranged across said series resistor R.

Since the phase detector PD of the phase-locked loop PLL also forms part of the frequency detection device (M1, LPF, LIM, M2, PD), the latter not only supplies a control signal which depends on the frequency difference between the actual IF carrier at the output of the IF section IF and the local IF carrier. After a frequency synchronization is reached between said actual IF carrier and the local IF carrier, said frequency detection device (M1, LPF, LIM, M2, PD) supplies a phase control signal which is dependent on the phase difference between these two carriers. The use of such a frequency-locked loop for a phase control is known from the article "Frequency and Phase Lock Loop" by R. Citta, published in IEEE Transactions on Consumer Electronics, Vol. CE-23, No. 3, Aug. 1977, pp. 358–365. Reference is made to this article for a further elaboration on the control action of the frequency-locked loop FLL shown in FIG. 1.

As is known from this article, the frequency-locked loop FLL has two stable phase lock points, creating a phase ambiguity in generating the local IF carrier. This renders the frequency-locked loop FLL less suitable for the in-phase synchronization of the local IF carrier with the actual IF carrier.

In the TV receiver according to the invention, the frequency-locked loop FLL is therefore only used for frequency control and not for phase control. For a phase control and phase lock between the local IF carrier and the actual IF carrier use is made of the phase-locked loop (PD, VI1, A, LF, VCO). To realize an unambiguous phase coupling solely at the phase lock point of the phase-locked loop PLL, the loop gain in the PLL should be larger than that in the FLL. This can be achieved by choosing the signal gain in the frequency detection device to be smaller than the signal gain in the phase detector PD. In practice it is sufficient to adjust the signal gain of the second multiplier stage M2 to a smaller value than that of the phase detector PD, for example, to 0.8 of the gain of the phase detector PD.

Unlike said known TV receiver, the phase detector PD is adjusted in such a way that linear signal processing takes place and the IF signal applied to the frequency and phase-locked loop FPLL is not limited. Consequently, phase perturbations of the local in-phase IF carrier due to amplitude-phase conversions and/or signal delays of the local in-phase IF carrier with respect to the actual IF carrier are avoided and a delay compensation at the input of the synchronous detection device need not be carried out. To this end, the phase detector PD and the synchronous detection device SD are preferably realized by means of two mutually corresponding multiplier circuits formed on one and the same substrate.

In the TV receiver shown, an active loop filtering is chosen providing the possibility of adding the output signals of the phase detector and of the frequency detection device by means of a simple node such as the node A, and of selecting the control signal for the controllable oscillator VCO by means of a simple filter circuit such as the loop filter LF. The first and second voltage-current converters VI1 and VI2 are used for this purpose in the frequency and phase-locked loop FPLL, which converters are incorporated between the phase detector PD and a node A functioning as a summing circuit and between the second multiplier M2 and said node A, respectively.

In a practical embodiment the natural frequency fn of the frequency and phase-locked loop FPLL was approximately 15 kHz and the loop attenuation was $(\beta)2$, resulting in a loop bandwidth of approximately 60 kHz. The first series capacitance C1 of the loop filter LF was of the order of 100 nF, the series resistor R was of the order of 400 Ohms and the shunt capacitance C2 was of the order of 2 to 15 nF. The series RC member (R, C1) is connected between said node A and ground. The loop filter LF is of the second order due to the use of the shunt capacitance C2. At said dimensioning of the loop filter LF and more generally at a value of the shunt capacitance C2 of the order of 2 to 15% of that of the series capacitance C1, an effective video signal suppression is obtained in the control signal path of the controllable oscillator VCO. This prevents frequency and/or phase perturbations from occurring in the local IF carrier which is applied to SD. Consequently, crosstalk of picture signal components in the audio signal is prevented. Moreover, the extra phase shift introduced by the shunt capacitance C2 in the loop is small enough to leave the loop stability unharmed and to keep the capture period of the FPLL within acceptable limits.

Figure 1A:
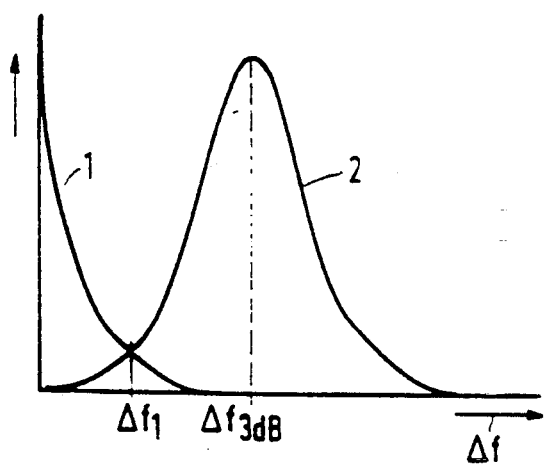
FIG 1a shows the operation of the frequency and phase-locked loop.

The operation of the frequency and phase-locked loop FPLL can be explained with reference to FIG. 1a. This Figure shows the variation of the signal energy (E) of the control signal of the controllable oscillator VCO at the output of the loop filter LF as a function of the frequency difference between the local IF carrier, on the one hand, and the actual IF carrier, on the other hand. Curve 1 shows this for the phase-locked loop PLL (PD, VI1, A, LF, VCO), curve 2 shows this for the frequency-locked loop FLL (M1, LPF, LIM, M2, PD, VI2, A, LF, VCO). As is apparent from this Figure, most energy occurs in the FLL loop when the difference frequency in the loop corresponds to the 3 dB point of the low-pass filter LPF. This 3 dB point occurred at approximately 0.3 MHz in a practical embodiment. In a comparatively wide frequency range around this 3 dB point the frequency control is mainly ensured by the frequency-locked loop FLL. However, the contribution of the phase-locked loop PLL to the frequency control increases with a decreasing frequency difference and exceeds that of the FLL when said frequency difference has decreased below the point of intersection of the curves 1 and 2, i.e. below the value $\delta F1$. The phase-locked loop PLL is active at frequency differences below this value $\delta F1$ and ensures a further frequency control until a phase control in the phase-locked loop PLL occurs after a frequency synchronization at δF1=0, followed by a phase lock of the local IF carrier with the actual IF carrier.

The loop filter LF supplies a DC signal which is applied as a control signal to the controllable oscillator VCO as well as to a comparison circuit C. In this circuit the control signal is compared with a threshold or reference value REF. The comparison may be carried out in a digital or analog form, for which purpose said control signal in an analog or digital form is compared with an analog or digital reference value REF. An output of the comparison circuit C is coupled to a microprocessor MP in which a tuning control signal for the tuning oscillator TO is generated in dependence upon the relative value of the control signal with respect to the reference value. An output of the synchronous detection device SD is coupled to a synchronization identification circuit SI with which the presence of synchronizing pulses and hence the presence of a TV program signal can be detected at the output of the synchronous detection device SD. This is possible when the phase of the local in-phase IF carrier of the FPLL corresponds to the actual IF carrier. The synchronization identification circuit SI then supplies an identification signal to the microprocessor MP.

The microprocessor MP receives control signals for controlling or setting, inter alia the tuning from an operating section TC to be manually operated by a user.

Figure 2:
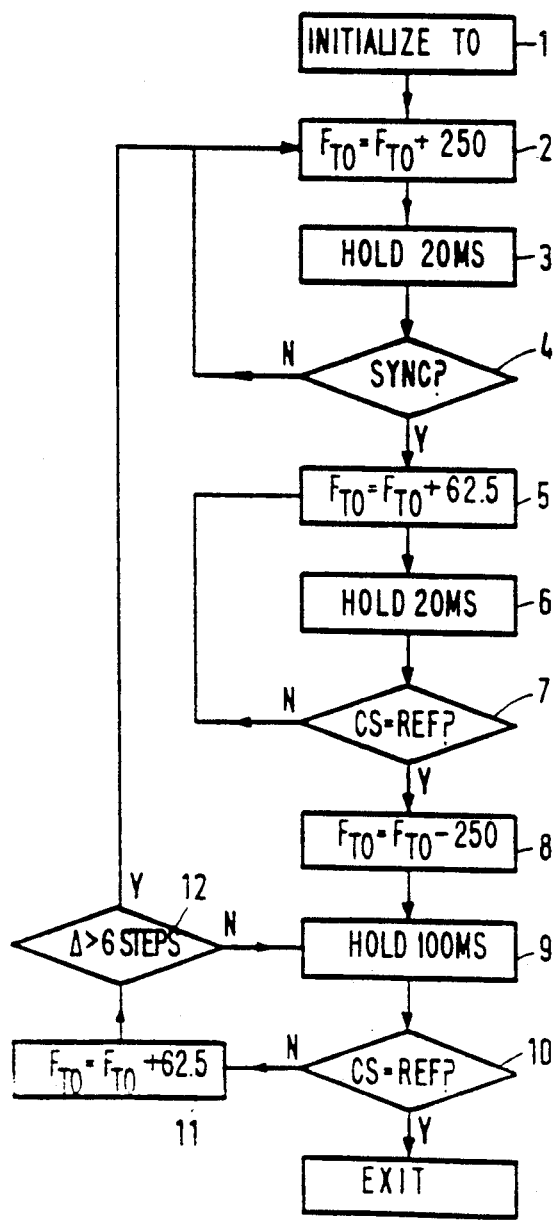
FIG. 2 is a flowchart of a search mode for use in the TV receiver of FIG. 1.

FIG. 2 shows a flowchart of a search tuning mode for use in the TV receiver of FIG. 1. The search tuning is started by means of a start signal to be supplied by the user to the microprocessor MP via the operating section TC. The microprocessor MP then assumes its start phase (step 1) in which the tunable oscillator TO is possibly set at an initial tuning frequency. The microprocessor MP realizes a variation, for example an increase of the tuning frequency $F_{TO}$ of the tuning oscillator TO in frequency steps of 250 kHz in a given TV RF reception band. After each frequency step the microprocessor MP retains the tuning frequency for 20 msec in step 3. This waiting time of 20 msec is sufficiently large to cause the frequency and phase-locked loop FPLL to capture the actual IF carrier at the output of the IF section IF, if present. If the latter is true, the FPLL supplies a local in-phase IF carrier to the SD within said waiting time, which carrier is frequency and phase-synchronous with the actual IF carrier and the presence of a TV program signal is detected by SI in block 4. A correct tuning is then not necessary, i.e. it is not necessary for the frequency of the actual and hence that of the local in-phase IF carrier to correspond to the correct intermediate frequency. To realize the latter, the search continues with step 5.

If it is ascertained in block 4 that there have been no synchronizing pulses at the output of the synchronous detection device SD within the waiting time of 20 msec, the search returns to the above-mentioned step 2, followed again by step 3 and block 4 until SI detects the presence of a TV program signal at the output of SD.

In the next step 5 the microprocessor MP varies the frequency of the tuning oscillator TO by a frequency step of 62.5 kHz in the direction of the search, i.e. in the given example MP raises the tuning frequency by this frequency step. After this step a waiting time of 20 msec follows in block 6, during which time the frequency and phase-locked loop FPLL can realize a frequency and phase synchronization between the actual IF carrier and the local IF carrier. In block 7 the control signal of the controllable oscillator VCO is compared with the reference value REF in the comparison circuit C. This comparison is realized after each step of 62.5 kHz until the amplitude of the control signal of the controllable oscillator VCO has become equal to the reference value REF within a given tolerance range.

Due to disturbances, there may be equality between the amplitude of the control signal of the controllable tuning oscillator VCO and the reference value REF without receiving a TV RF reception signal. To reduce the sensitivity to such disturbances, the tuning frequency of the tuning oscillator TO is reset, in step 8, over a frequency difference of 250 kHz opposed to the direction of the search, i.e. in the last-mentioned example this frequency is decreased by 250 kHz. Subsequently, the tuning of the tuning oscillator TO is retained in step 9 for a waiting time of 100 msec so as to enable the frequency and phase-locked loop FPLL to realize a correct frequency and phase synchronization between the local IF carrier and the actual IF carrier. In block 10 there is again a comparison between the amplitude of the control signal of the controllable oscillator VCO with the reference value REF. If the amplitude of the control signal is not equal to the reference value, the tuning frequency of the tuning oscillator TO is varied in the search direction over a frequency step of 62.5 kHz, i.e. in the given example it is raised by 62.5 kHz, followed by the aforementioned step 9. This is realized until it is ascertained in block 10 that the amplitude of the control signal is equal to the reference value REF or until it is ascertained in block 12 that more than 6 frequency steps (Δ) of 62.5 kHz have been taken. If the latter holds true and if the control signal of the controllable oscillator VCO has not become equal to the reference value REF, there is no TV program signal in the relevant frequency range and the search returns to step 2. If in block 10 the VCO control signal becomes equal to the reference value REF, a correct tuning to a TV RF reception signal is obtained, i.e. the actual IF carrier frequency corresponds to the correct IF carrier frequency and a correct display of the received TV program signal is possible.

The control signal of the controllable oscillator may, however, also be used for automatic tuning frequency control, for which purpose this VCO control signal is to be suitably applied to the tuning oscillator TO. This results in an automatic tuning control of the actual IF carrier at the correct intermediate frequency, i.e. at the frequency to which the IF section IF is tuned. This correct intermediate frequency may vary, for example, due to ambient factors such as temperature variations or as a result of ageing. This automatic tuning control may also realize automatic tuning to offset channels which deviate from the normal channel frames over a given frequency distance.

The invention is not limited to the embodiments described hereinbefore. It will not be difficult to those skilled in the art to conceive alternative circuits using the inventive idea. For example, it is possible to dispense with the synchronization identification and to identify a recognition of correct tuning by way of the amplitude of the VCO control signal itself. It is also possible to omit the limiter LIM and use a frequency detection circuit of another type, for example, a differentiator instead of LIM. Moreover, the shunt capacitance C2 may be left out in the loop filter LF and use a first-order loop filter, or a passive loop filter can be used, precluding the use of the voltage-current converters VI1 and VI2. Under circumstances the choice will be a limiter to be incorporated between the IF section and the frequency and phase-locked loop FPLL and a delay compensation circuit to be incorporated between the IF section and the synchronous detection device.

What is claimed is:

1. A TV receiver comprising a radio frequency section, a mixer stage to which a tuning frequency is applied from a tuning oscillator, an intermediate frequency section, a synchronous detection device and a frequency- and phase-locked loop, said intermediate frequency section being coupled to a phase detector of the phase-locked loop and to a frequency detection device of the frequency-locked loop, said phase detector and said frequency detection device being commonly coupled to a loop branch having the two loops in common and incorporating a loop filter and a controllable oscillator, said controllable oscillator applying a local in-phase carrier to the synchronous detection device and a local phase quadrature carrier to the phase detector, characterized in that an output of the loop filter carrying a control signal for the controllable oscillator is coupled to a circuit for generating a tuning control signal, said circuit for generating a tuning control signal comprising a comparison circuit for deriving the tuning control signal for the tuning oscillator from a difference between the value of the control signal of the controllable oscillator and a reference value, said controllable oscillator supplying an oscillator frequency which is equal to said intermediate frequency when the control signal for the controllable oscillator is equal to the reference value.

2. A TV receiver as claimed in claim 1, characterized in that the phase detector also forms part of the frequency detection device, said frequency detection device comprising a first multiplier circuit having a first input coupled to the intermediate frequency section and an output coupled, via a low-pass filter, to a first input of a second multiplier circuit, the local in-phase carrier from the controllable oscillator being applied to a second input of said first multiplier circuit, and said second multiplier circuit having a second input coupled to an output of the phase detector, an output of the second multiplier circuit being coupled to the loop filter.

3. A TV receiver as claimed in claim 1, characterized in that the closed loop gain of the phase-locked loop is larger than that of the frequency-locked loop within the locking range of the phase-locked loop.

4. A TV receiver as claimed in claim 1, characterized in that the synchronous detection device and the phase detector have a mutually substantially equal gain.

5. A TV receiver as claimed in claim 2, characterized in that the low-pass filter is coupled to the second multiplier circuit via a limiting device.

6. A TV receiver as claimed in claim 1, characterized in that the circuit for generating the tuning control signal is incorporated in a search tuning circuit for varying the tuning frequency step-wise until the output signal of the loop filter corresponds to the reference value within a given step value, said step value corresponding to a frequency step which is smaller than the capture range of the frequency-locked loop.

7. A TV receiver as claimed in claim 1, characterized in that the loop filter has a current signal input and a grounded series RC member comprising a series resistor and a series capacitance, said series resistor being shunted by a shunt capacitance, said shunt capacitance being of the order of 2% to 15% of the series capacitance.

8. A TV receiver as claimed in claim 1, characterized in that the frequency and phase-locked loop has a natural frequency of the order of 15 kHz and an attenaution of the order of two.

* * * * *